(12) United States Patent
Muraoka et al.

(10) Patent No.: US 10,431,266 B2
(45) Date of Patent: Oct. 1, 2019

(54) SEMICONDUCTOR STORAGE DEVICE

(71) Applicant: TOSHIBA MEMORY CORPORATION, Tokyo (JP)

(72) Inventors: Kazuyoshi Muraoka, Yokohama Kanagawa (JP); Masami Masuda, Chigasaki Kanagawa (JP); Junya Matsuno, Kawasaki Kanagawa (JP); Masatoshi Kohno, Kawaguchi Saitama (JP); Yuui Shimizu, Yokohama Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 16/055,436

(22) Filed: Aug. 6, 2018

(65) Prior Publication Data
US 2019/0088294 A1 Mar. 21, 2019

(30) Foreign Application Priority Data

Sep. 19, 2017 (JP) .................................. 2017-178830

(51) Int. Cl.
| | |
|---|---|
| *G11C 7/10* | (2006.01) |
| *H03K 19/003* | (2006.01) |
| *H01L 27/11529* | (2017.01) |
| *G11B 33/10* | (2006.01) |
| *G11C 16/26* | (2006.01) |

(52) U.S. Cl.
CPC ............ *G11C 7/1057* (2013.01); *G11B 33/10* (2013.01); *G11C 16/26* (2013.01); *H01L 27/11529* (2013.01); *H03K 19/00361* (2013.01); *H03K 19/00384* (2013.01); *G11C 7/1063* (2013.01)

(58) Field of Classification Search
CPC ..... G11C 7/1057; G11C 16/26; G11C 7/1063; H03K 19/00361; H03K 19/00384; H01L 27/11529; G11B 33/10
USPC ..................................................... 365/189.05
See application file for complete search history.

(56) References Cited

U.S. PATENT DOCUMENTS

| | | | |
|---|---|---|---|
| 6,040,737 A | 3/2000 | Ranjan et al. | |
| 6,538,464 B2 * | 3/2003 | Muljono ............ | H03K 19/0005 326/27 |
| 7,425,849 B2 | 9/2008 | Gupta et al. | |
| 7,929,357 B2 | 4/2011 | Jeon | |
| 8,811,096 B2 | 8/2014 | Matsuoka | |

(Continued)

FOREIGN PATENT DOCUMENTS

| | | |
|---|---|---|
| JP | 2010-178346 A | 8/2010 |
| JP | 2013-201667 A | 10/2013 |
| JP | 6124638 B2 | 5/2017 |

*Primary Examiner* — Fernando Hidalgo
(74) *Attorney, Agent, or Firm* — Kim & Stewart LLP

(57) ABSTRACT

A semiconductor storage device includes: a first terminal, a plurality of first and second output buffers, a register, a plurality of first pre-drivers including a plurality of first transistors operating according to a first signal, and a plurality of second pre-drivers including a plurality of second transistors operating according to a second signal. A first output control circuit selects the first pre-drivers in accordance with a third signal obtained by conversion of the second signal. A second output control circuit selects the second pre-drivers in accordance with a fourth signal obtained by conversion the first signal. A third output circuit transmits an output signal to the first and second output circuits.

20 Claims, 11 Drawing Sheets

(56) References Cited

U.S. PATENT DOCUMENTS

| | | | |
|---|---|---|---|
| 2004/0057322 A1* | 3/2004 | Kim .................... | G11C 7/1051 |
| | | | 365/230.06 |
| 2012/0099383 A1* | 4/2012 | Kim .................... | G11C 7/1057 |
| | | | 365/189.02 |

* cited by examiner

SEMICONDUCTOR STORAGE DEVICE

CROSS-REFERENCE TO RELATED APPLICATION

This application is based upon and claims the benefit of priority from Japanese Patent Application No. 2017-178830, filed Sep. 19, 2017, the entire contents of which are incorporated herein by reference.

FIELD

Embodiments described herein relate generally to a semiconductor storage device.

BACKGROUND

NAND flash memories are known as semiconductor storage devices.

DETAILED DESCRIPTION

Figure 1:
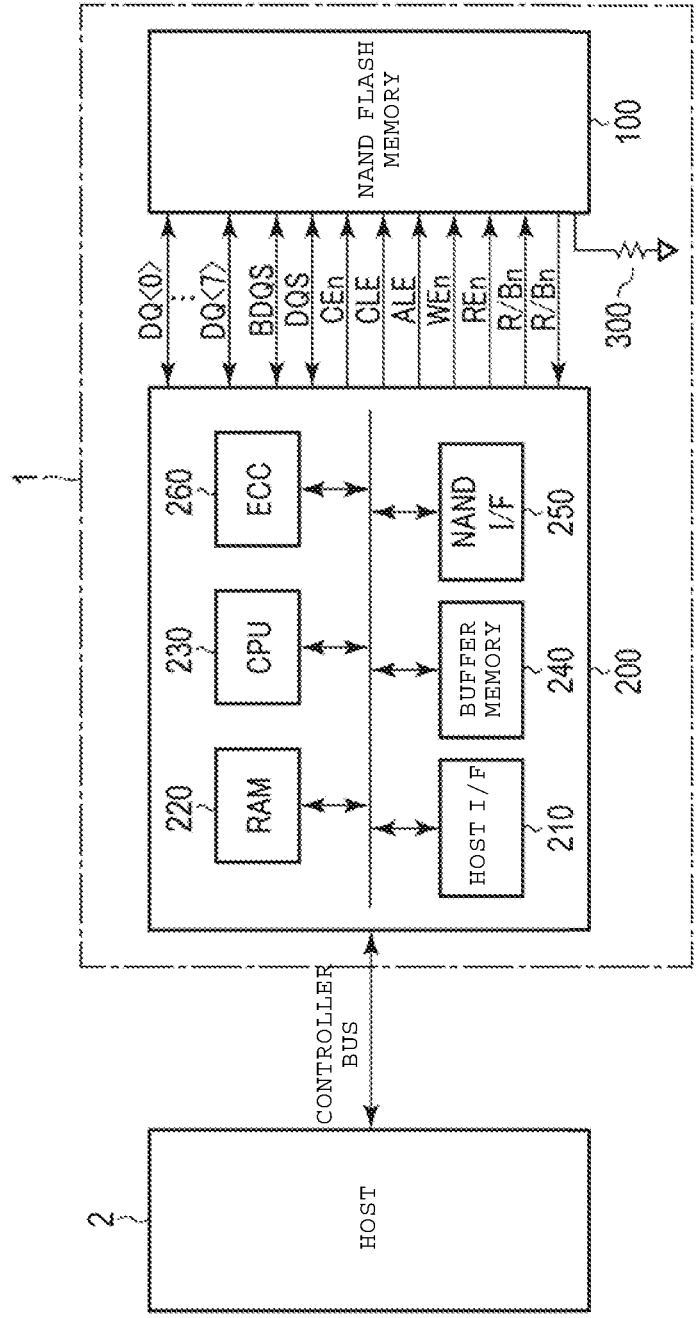
FIG. 1 is a block diagram illustrating a memory system including a semiconductor storage device according to a first embodiment.

Embodiments hereof provide a semiconductor storage device capable of having improved reliability.

In general, according to one embodiment, a semiconductor storage device includes a first terminal configured to output a signal to an external device, a plurality of first output buffers, and a plurality of second output buffers connected to the first terminal. A register is configured to retain a first signal corresponding to the plurality of second output buffers and a second signal corresponding to the plurality of first output buffers. A plurality of first pre-drivers is provided and each first pre-driver is connected to one of the plurality of first output buffers. Each first pre-driver includes a plurality of first transistors connected in parallel between a first inverter and a ground voltage supply terminal, The first transistors are configured to operate in accordance with values of the first signal. A plurality of second pre-drivers is provided. Each second pre-driver is connected to one of the plurality of second output buffers. Each second pre-driver includes a plurality of second transistors connected in parallel between a second inverter and a power voltage supply terminal. The second transistors are configured to operate in accordance with values of the second signal. A first output control circuit is connected to the plurality of first pre-drivers through a plurality of first signal lines and configured to select at least one of the plurality of first signal lines in accordance with values of a third signal corresponding to a conversion of the second signal. A second output control circuit is connected to the plurality of second pre-drivers through a plurality of second signal lines. The second output control circuit is configured to select at least one of the plurality of second signal lines in accordance with values of a fourth signal corresponding to a conversion of the first signal. A third output control circuit is configured to transmit an output signal to the first and second output control circuits.

Hereinafter, embodiments will be described with reference to the drawings. In the following description, common reference numerals are given to constituent elements that have the same functions and configurations.

In the following description, a signal X<m: 0> (where m is a natural number) is a (m+1)-bit signal and means a set of signals X<0>, X<1> . . . and X<m> which are 1-bit signals. In the signal X<m: 0>, that is, a (m+1)-bit digital signal, X<m> is referred to as the most significant bit and X<0> is referred to as the least significant bit. A constituent element Y<m: 0> means a set of constituent elements Y<0>, Y<1>, . . . , and Y<m> that correspond to inputs or outputs of the signal X<m: 0> in a one-to-one manner.

1. First Embodiment

A semiconductor storage device according to a first embodiment will be described. Hereinafter, a NAND flash memory will be described as an example of the semiconductor storage device.

1.1 Configuration 1.1.1 Memory System

The memory system including the semiconductor storage device according to the first embodiment will be described with reference to FIG. 1.

As illustrated in FIG. 1, a memory system 1 includes a controller 200, a NAND flash memory 100, and a reference resistor 300. The controller 200 and the NAND flash memory 100 may integrated into one semiconductor storage device such as an SD™ card or a solid-state drive (SSD).

The controller 200 commands the NAND flash memory 100 to read, write, or erase data in response to a command from a host device 2. The controller 200 manages a memory space of the NAND flash memory 100. The controller 200 is connected to the NAND flash memory 100 via a NAND bus.

The reference resistor 300 functions as reference resistor that calibrates output impedance of the NAND flash memory 100. For example, one end of the reference resistor 300 is grounded and the other end of the reference resistor 300 is connected to the NAND flash memory 100. The reference resistor 300 may be contained within the NAND flash memory 100.

The NAND flash memory 100 includes a plurality of memory cells and stores data in a nonvolatile manner. A plurality of NAND flash memories 100 may be used together. In this case, each of the plurality of NAND flash memories 100 can be independently operated under the control of the controller 200.

The NAND flash memory 100 is connected to the controller 200 via the NAND bus and is operated based on a command from the controller 200. More specifically, the NAND flash memory 100 transmits and receives, for example, 8-bit signals DQ<0> to DQ<7> (hereinafter simply referred to as signals DQ or signals DQ<7: 0> when DQ<0> to DQ<7> are not specified) to and from the controller 200. The signals DQ<7: 0> include, for example, data, addresses, and commands. The NAND flash memory 100 transmits and receives a clock signal DQS and a clock signal BDQS, which is an inverted signal of the signal DQS, to and from the controller 200. The signals DQS and BDQS are used, for example, to control timings of transmission and reception of the signals DQ<7: 0>. The NAND flash memory 100 receives, for example, a chip enable signal CEn, a command latch enable signal CLE, an address latch enable signal ALE, a write enable signal WEn, and a read enable signal REn from the controller 200. Then, the NAND flash memory 100 transmits a ready/busy signal R/Bn to the controller 200.

The chip enable signal CEn is a signal for enabling the NAND flash memory 100 and is asserted at, for example, a low ("L") level. The command latch enable signal CLE is a signal indicating that the signal DQ is a command and is asserted at, for example, a high ("H") level. The address latch enable signal ALE is a signal indicating that the signal DQ is an address and is asserted at, for example, the "H" level. The write enable signal WEn is a signal for writing a received signal into the NAND flash memory 100 and is asserted at, for example, the "L" level when a command, an address, data, or the like is received from the controller 200. Accordingly, a signal DQ is received in the NAND flash memory 100 when the write enable signal WEn is toggled. The read enable signal REn is a signal used for the controller 200 to read data from the NAND flash memory 100. The read enable signal REn is asserted at, for example, the "L" level. Accordingly, the NAND flash memory 100 outputs the signal DQ to the controller 200 based on the toggled read enable signal REn. The ready/busy signal R/Bn is a signal indicating whether the NAND flash memory 100 is in a busy state or a ready state in which a command is not receivable or is receivable from the controller 200 and is considered to be at the "L" level, for example, when the NAND flash memory 100 is in the busy state.

1.1.2 Controller

Next, the controller of the memory system according to the first embodiment will be described with reference to FIG. 1. The controller 200 includes a host interface circuit 210, an internal memory (RAM) 220, a processor (CPU) 230, a buffer memory 240, a NAND interface circuit 250, and an ECC circuit 260.

The host interface circuit 210 is connected to the host device 2 via a controller bus and governs communication with the host device 2. The host interface circuit 210 transmits commands and data received from the host device 2 to the processor 230 and the buffer memory 240. The host interface circuit 210 transmits data in the buffer memory 240 to the host device 2 in response to a command of the processor 230.

The NAND interface circuit 250 is connected to the NAND flash memory 100 via the NAND bus and governs communication with the NAND flash memory 100. The NAND interface circuit 250 transmits a command received from the processor 230 to the NAND flash memory 100. The NAND interface circuit 250 transmits write data in the buffer memory 240 to the NAND flash memory 100 at the time of writing. Further, the NAND interface circuit 250 transmits data read from the NAND flash memory 100 to the buffer memory 240 at the time of reading.

The processor 230 controls the operation of the whole controller 200. The processor 230 issues various commands in response to commands of the host device 2 to transmit the commands to the NAND flash memory 100. For example, when a write command is received from the host device 2, the processor 230 transmits a write command to the NAND flash memory 100 in response to the write command. The same applies to the time of reading and the time of erasing. The processor 230 executes various processes such as wear leveling to manage the NAND flash memory 100. Further, the processor 230 executes various arithmetic operations. For example, the processor 230 executes a data encryption process or a randomization process.

The ECC circuit 260 executes an error checking and correcting (ECC) process on data.

The internal memory 220 is, for example, a semiconductor memory such as a DRAM and is used as a working area of the processor 230. The internal memory 220 retains firmware or various management tables used to manage the NAND flash memory 100.

The buffer memory 240 temporarily retains data or the like received from the NAND flash memory 100 and the host device 2 by the controller 200. The buffer memory 240 may temporarily retain, for example, a ZQ calibration result of the NAND flash memory 100.

1.1.3 NAND Flash Memory

Next, the NAND flash memory 100 will be described with reference to FIG. 2.

Figure 2:
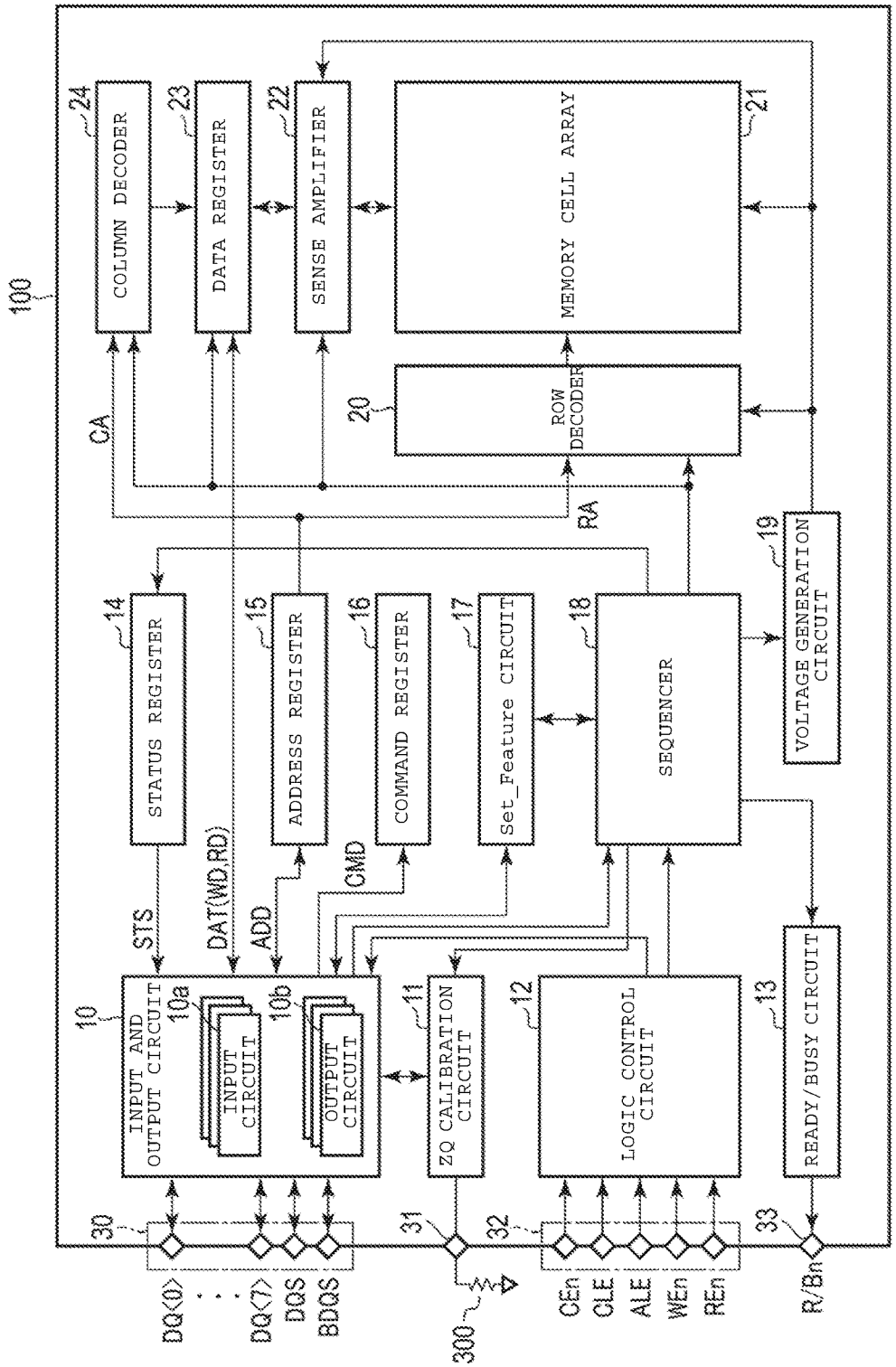
FIG. 2 is a block diagram illustrating the semiconductor storage device according to the first embodiment.

As illustrated in FIG. 2, the NAND flash memory 100 includes an input and output circuit 10, a ZQ calibration circuit 11, a logic control circuit 12, a ready/busy circuit 13, a status register 14, an address register 15, a command register 16, a Set_Feature circuit 17, a sequencer 18, a voltage generation circuit 19, a row decoder 20, a memory cell array 21, a sense amplifier 22, a data register 23, a column decoder 24, an input and output pad group 30, a ZQ pad 31, an input pad group 32, and an RB pad 33.

The input and output circuit 10 transmits and receives the signal DQ<7: 0>, the signal DQS, and the signal BDQS to and from the controller 200. The input and output circuit 10 may receive the signal DQS and the signal BDQS from the controller 200 via the logic control circuit 12. The input and output circuit 10 transmits a command CMD in the signal DQ<7: 0> to the command register 16. The input and output circuit 10 transmits and receives an address ADD to and from the address register 15 and transmits and receives data to and from the data register 23. The input and output circuit 10 transmits parameter setting of various operations received from the controller 200 to the Set_Feature circuit 17 and receives parameter information (hereinafter referred to as "Ron setting value information") regarding a setting value (for example, one setting value among 25 Ω, 35Ω, and 50Ω) of the output impedance from the Set_Feature circuit 17. The input and output circuit 10 includes a plurality of input circuits 10*a* and a plurality of output circuits 10*b* corresponding to a plurality of signal types. For example, a pair of one input circuit 10*a* and one output circuit 10*b* is connected to one pad in the input and output pad group 30 and is used to transmit and receive one bit of the signal DQ<7: 0>, the signal DQS, or the signal BDQS. Hereinafter, the input circuit 10*a* and the output circuit 10*b* corresponding to a signal DQ<k> (where k is an integer of 0≤k<7) are referred to as an input circuit 10*a*<k> and an output circuit 10*b*<k>. The input circuit 10*a* and the output circuit 10*b* corresponding to the signal DQS are referred to as an input circuit 10*a*_DQS and an output circuit 10*b*_DQS. The input circuit 10*a* and the output circuit 10*b* corresponding to the signal BDQS are referred to as an input circuit 10*a*_BDQS and an output circuit 10*b*_BDQS. The details of the output circuit 10*b* will be described below.

The input and output pad group 30 includes pads 30<7: 0>, 30_DQS, and 30_BDQS corresponding to the signal DQ<7: 0>, the signal DQS, and the signal BDQS. The input and output pad group 30 is connected to the input and output circuit 10 and to the NAND bus. Each pad in the input and output pad group 30 can be recognized as one output terminal, having a certain output impedance, from the exterior of the NAND flash memory 100.

The ZQ calibration circuit 11 is connected to the reference resistor 300 via the ZQ pad 31. The ZQ calibration circuit 11 has a function of executing a ZQ calibration operation to calibrate the output impedance of the NAND flash memory 100 to a desired impedance value using the reference resistor 300 in response to an instruction of the sequencer 18. For example, the ZQ calibration circuit 11 measures output impedance at an upper limit temperature and a lower limit temperature of an operation environment temperature range of the NAND flash memory 100 and calculates a calibration value of a transistor size of an output buffer in the output circuit 10*b* to be described herein. In the following description, transistors having different transistor sizes refer to transistors having, for example, gate widths that are different but other transistor parameters, such as gate lengths, gate oxide film thickness, and diffusion layer conditions of a source and a drain, are the same. The calibration of the transistor size indicates that one selected transistor or a combination of transistors from among a plurality of transistors connected in parallel is changed and a composite on-state resistance Ron of the selected transistors is calibrated, i.e., established or set as a desired value. A calibration result of the ZQ calibration circuit 11 (hereinafter referred to as "ZQ information") is transmitted to, for example, the output circuit 10*b*.

One end of the ZQ pad 31 is connected to the reference resistor 300 and the other end of the ZQ pad 31 is connected to the ZQ calibration circuit 11. The ZQ pad 31 can be recognized as one output terminal having a certain output impedance from the exterior of the NAND flash memory 100.

The logic control circuit 12 is connected to the input pad group 32. The logic control circuit 12 receives the signals CEn, CLE, ALE, WEn, and REn from the controller 200 via the input pad group 32. The logic control circuit 12 controls the input and output circuit 10 and the sequencer 18 based on the received signals.

The input pad group 32 includes a plurality of pads corresponding to the signals CEn, CLE, ALE, WEn, and REn and connects the logic control circuit 12 to the NAND bus.

The ready/busy circuit 13 is connected to the RB pad 33. The ready/busy circuit 13 transmits the ready/busy signal R/Bn to the controller 200 according to an operational status of the sequencer 18. The ready/busy circuit 13 includes the output circuits 10*b*.

The RB pad 33 connects the ready/busy circuit 13 to the NAND bus.

The status register 14 temporarily retains the status information STS, for example, in a write operation, a read operation, and an erasing operation of the data and notifies the controller 200 whether the operation has properly ended.

The address register 15 temporarily retains the address ADD received from the controller 200 via the input and output circuit 10. Then, the address register 15 transmits a row address RA to the row decoder 20 and transmits a column address CA to the column decoder 24.

The command register 16 temporarily stores the command CMD received from the controller 200 via the input and output circuit 10 and transmits the command CMD to the sequencer 18.

The Set_Feature circuit 17 stores the parameter settings for various operations that are received from the controller 200 and sets parameters in the various operations. For example, the sequencer 18 executes an operation (hereinafter referred to as "power on read (POR)") of reading the parameters from the Set_Feature circuit 17 when the NAND flash memory 100 is activated (that is, when power is turned on). The Set_Feature circuit 17 may be installed in the sequencer 18 and the parameter setting may be retained in the memory cell array 21.

The sequencer 18 controls an operation of the whole NAND flash memory 100. More specifically, the sequencer 18 controls, for example, the input and output circuit 10, the ZQ calibration circuit 11, the ready/busy circuit 13, the status register 14, the Set_Feature circuit 17, the voltage generation circuit 19, the row decoder 20, the sense amplifier 22, the data register 23, and the column decoder 24 based on the command CMD retained by the command register 16 to execute a write operation, a read operation, and an erasing operation.

The voltage generation circuit 19 generates the voltages necessary for the write operation, the read operation, and the erasing operation under the control of the sequencer 18 and supplies the generated voltages to, for example, the memory cell array 21, the row decoder 20, and the sense amplifier 22. The row decoder 20 and the sense amplifier 22 apply a voltage supplied from the voltage generation circuit 19 to memory cell transistors in the memory cell array 21.

The memory cell array 21 includes a plurality of nonvolatile memory cell transistors (referred to as "memory cells") associated with rows and columns of the memory cell array 21. The memory cell array 21 retains information based on the on-state resistance Ron (hereinafter referred to as "Ron information") of the transistors measured in a test process, before product shipment, in a nonvolatile manner. The Ron information is information for narrowing the output impedance to be suitable for a setting value. Based on the Ron information, transistor sizes of an output buffer and a pre-driver in the output circuit 10*b* are determined.

More specifically, in the pre-driver and the output buffer, for example, a plurality of transistors which may have different on-state resistances Ron due to a difference in a transistor size (gate width) are connected in parallel. By selecting one or a plurality of transistors based on the Ron information, a composite transistor property such as the size, for example a composite gate width (and thus create a composite on-state resistance Ron) of the selected transistors can be optimized and the output impedance can be narrowed to be suitable for the setting value. For example, when 8 transistors which having different transistor sizes (the gate width and thus the on-state resistance Ron) are connected in parallel in the output buffer, the composite transistor size (the on-state resistance Ron) can be selected from 256 (=$2^8$) possible combinations of the 8 transistors. In this case, the Ron information corresponds to an 8-bit digital signal. Any number of transistors used to adjust the on-state resistance Ron can be used. For example, the Ron information is calculated from a result obtained by measuring on-state resistance Ronp of a p-channel MOSFET (hereinafter referred to as a "PMOS transistor") and on-state resistance Ronn of an n-channel MOSFET (hereinafter referred to as an "NMOS transistor") in a test process.

The row decoder 20 decodes the row address RA. The row decoder 20 applies a voltage necessary for the selected memory cell transistor based on a decoding result.

The sense amplifier 22 senses data read from the memory cell array 21 in a read operation. Then, the sense amplifier 22 transmits the read data RD to the data register 23. The sense amplifier 22 transmits the write data WD to the memory cell array 21 in a write operation.

The data register 23 includes a plurality of latch circuits. The latch circuit retains the write data WD and the read data RD. For example, in a write operation, the data register 23 temporarily retains the write data WD received from the input and output circuit 10 and transmits the write data WD to the sense amplifier 22. For example, in a read operation, the data register 23 temporarily retains the read data RD received from the sense amplifier 22 and transmits the read data RD to the input and output circuit 10.

The column decoder 24 decodes the column address CA during, for example, a write operation, a read operation, and an erasing operation and selects a latch circuit in the data register 23 according to a decoding result.

1.1.4 Connection of Input and Output Circuit and Input and Output Pad Group

Next, connection of the input and output circuit 10 and the input and output pad group 30 will be described with reference to FIG. 3.

Figure 3:
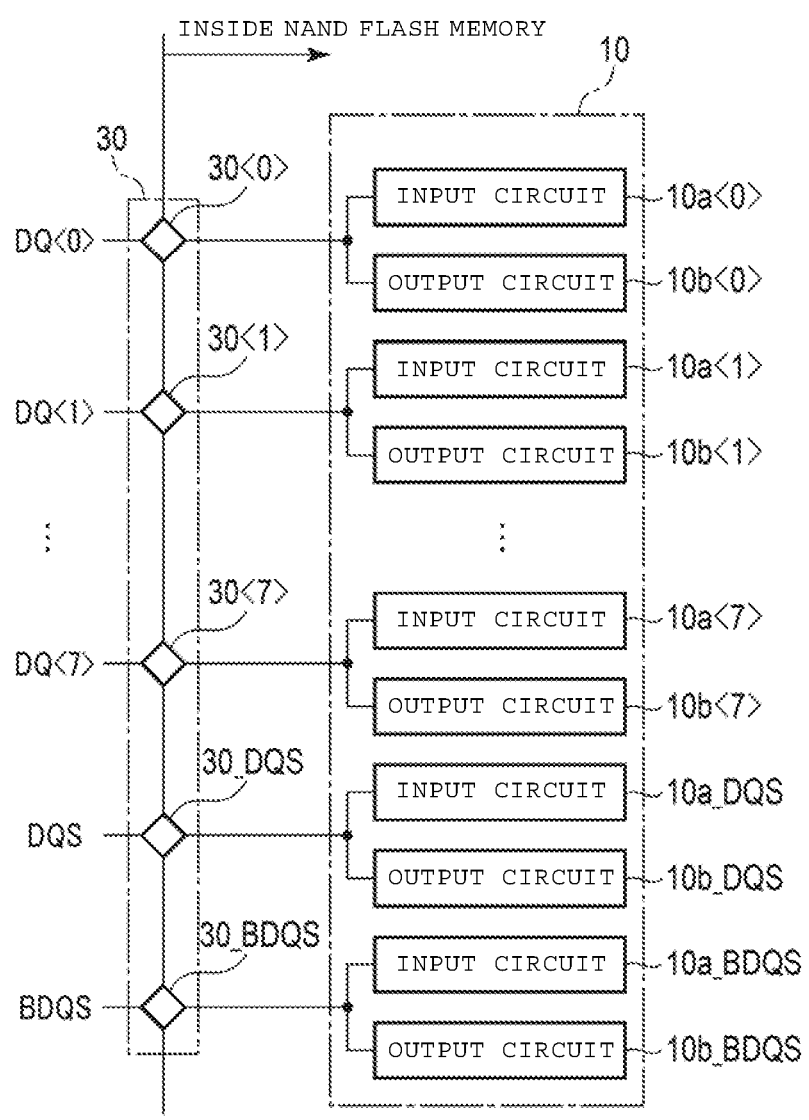
FIG. 3 is a block diagram illustrating the connection between an input and output pad group and an input and output circuit in the semiconductor storage device according to the first embodiment.

As illustrated in FIG. 3, the input and output pad group 30 includes pads 30<7: 0>, 30_DQS, and 30_BDQS corresponding to the signals DQ<7: 0>, DQS, and BDQS. As described above, the input and output circuit 10 includes input circuits 10*a*<7: 0>, 10*a*_DQS, and 10*a*_BDQS and output circuits 10*b*<7: 0>, 10*b*_DQS, and 10*b*_BDQS.

One pair of an input circuit 10*a* and an output circuit 10*b* is connected to each pad 30. More specifically, the input circuit 10*a*<k> and the output circuit 10*b*<k> are connected to a pad 30<k> corresponding to the signal DQ<k>. Similarly, the input circuit 10*a*_DQS and the output circuit 10*b*_DQS are connected to the pad 30_DQS corresponding to the signal DQS. The input circuit 10*a*_BDQS and the output circuit 10*b*_BDQS are connected to the pad 30_BDQS corresponding to the signal BDQS.

Each pair of input circuits 10*a* and output circuits 10*b* connected to the pad 30<7: 0>, 30_DQS, and 30_BDQS has substantially the same.

1.1.5 Output Circuit

Figure 4:
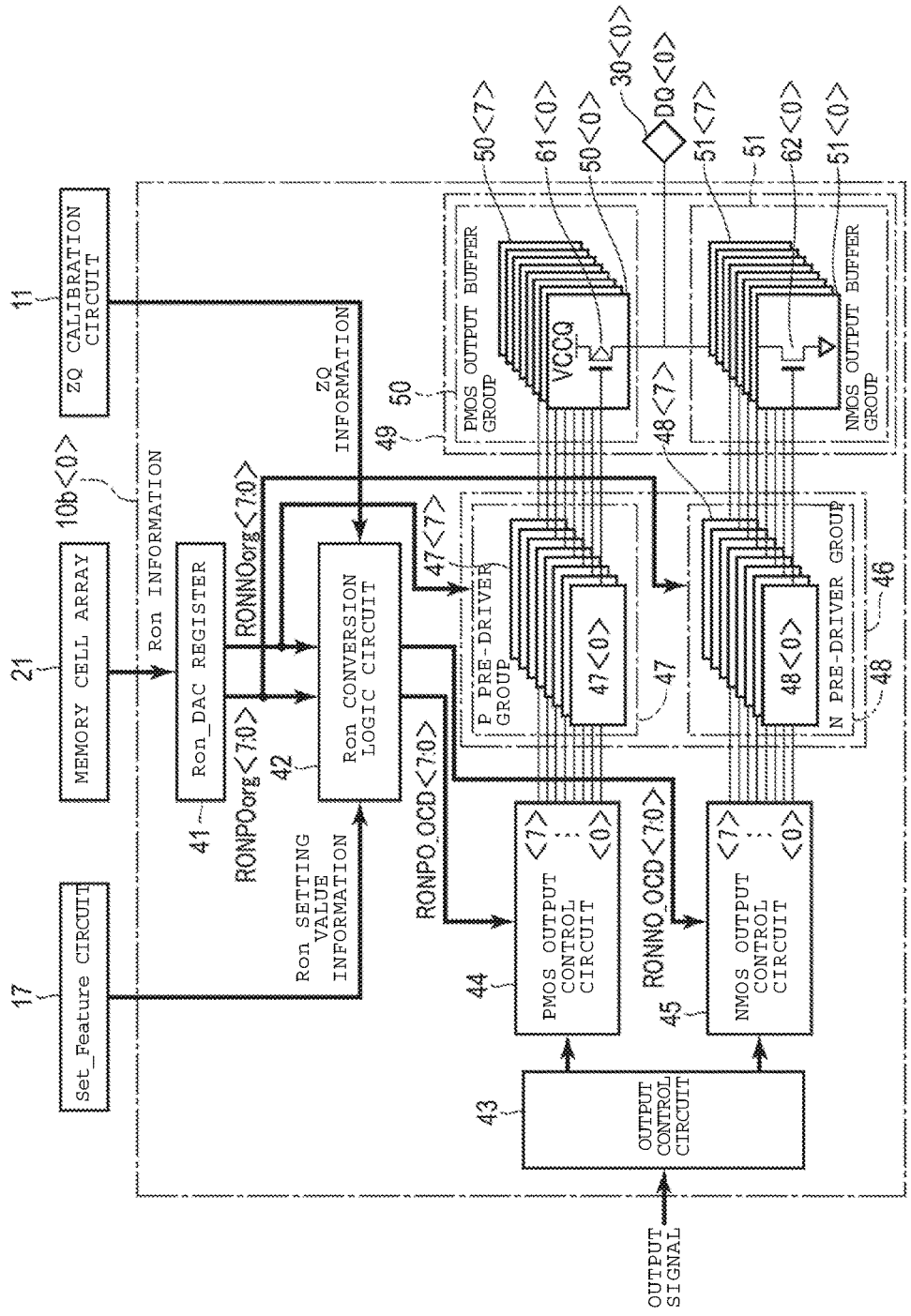
FIG. 4 is a block diagram illustrating an output circuit provided in the semiconductor storage device according to the first embodiment.

Next, the output circuit 10*b* will be described with reference to FIG. 4. In the example of FIG. 4, the output circuit 10*b*<0> corresponding to the input and output pad 30<0> of the signal DQ<0> will be described. The other output circuit 10*b*<k>, 10*b*_DQS, and 10*b*_BDQS have the same configuration. Further, in the example of FIG. 4, a case in which the Ron information is stored in the memory cell array 21 will be described. However, for example, the Ron information may be retained by cutting an e-Fuse installed in the NAND flash memory 100 based on the Ron information. Further, in the example of FIG. 4, a case in which the ZQ information is reflected will be described. However, the ZQ calibration circuit 11 and the ZQ information may be omitted.

As illustrated in FIG. 4, the output circuit 10*b*<0> includes a Ron_DAC register 41, a Ron conversion logic circuit 42, an output control circuit 43, a PMOS output control circuit 44, an NMOS output control circuit 45, a pre-driver 46, and an output buffer 49.

The Ron_DAC register 41 is a register that temporarily stores the Ron information retained in the memory cell array 21. The sequencer 18 stores the Ron information in one of the POR (power on read) operations in the Ron_DAC register 41 after the NAND flash memory 100 is powered on. More specifically, the Ron_DAC register 41 stores, as the Ron information, an 8-bit signal RONPOorg<7: 0> regarding a transistor size of transistors (hereinafter referred to as "output transistors") of the PMOS output buffer 50 and an 8-bit signal RONNOorg<7: 0> regarding a transistor size of output transistors of the NMOS output buffer 51. The signal RONPOorg<7: 0> stored in the Ron_DAC register 41 is transmitted to the Ron conversion logic circuit 42 and an N pre-driver group 48. The signal RONNOorg<7: 0> stored in the Ron_DAC register 41 is transmitted to the Ron conversion logic circuit 42 and a P pre-driver group 47.

The Ron conversion logic circuit 42 converts the signal RONPOorg<7: 0> received from the Ron_DAC register 41 to generate a signal RONPOOCD<7: 0> based on the Ron setting value information received from the Set_Feature circuit 17 and the ZQ information regarding the PMOS transistor received from the ZQ calibration circuit 11 and transmits the generated signal RONPO_OCD<7: 0> to the PMOS output control circuit 44. Similarly, the Ron conversion logic circuit 42 converts the signal RONNOorg<7: 0> received from the Ron_DAC register 41 to generate a signal RONNO_OCD<7: 0> based on the Ron setting value information received from the Set_Feature circuit 17 and the ZQ information regarding the NMOS transistor received from the ZQ calibration circuit 11 and transmits the generated signal RONNO_OCD<7: 0> to the NMOS output control circuit 45.

The output control circuit 43 transmits an output signal received from another circuit (for example, the data register 23) in the NAND flash memory 100 to the PMOS output control circuit 44 and the NMOS output control circuit 45.

The PMOS output control circuit 44 is connected to P pre-drivers 47<0> to 47<7> of the P pre-driver group 47 via 8 signal lines corresponding to bits of the signal RON-PO_OCD<7: 0>. The PMOS output control circuit 44 transmits an output signal received from the output control circuit 43 to the P pre-driver group 47 via signal line(s) selected based on the signal RONPO_OCD<7: 0>. That is, the PMOS output control circuit 44 selects the signal line(s) through which the output signal is transmitted to the P pre-driver group 47 based on the signal RONPO_OCD<7: 0>. More specifically, for example, the PMOS output control circuit 44 selects a signal line when the bit data for the corresponding signal line is "1" and does not select a signal line when the bit data for the corresponding signal line is "0" in each bit of the signal RONPO_OCD<7: 0>. For example, when the signal RONPO_OCD<7: 0> is "10100001", the PMOS output control circuit 44 transmits the output signal to the P pre-drivers 47<7>, 47<5>, and 47<0>.

The NMOS output control circuit 45 is connected to N pre-drivers 48<0> to 48<7> of the N pre-driver group 48 via 8 signal lines corresponding to bits of the signal RONNO_OCD<7: 0>, as in the PMOS output control circuit 44. The NMOS output control circuit 45 transmits an output signal received from the output control circuit 43 to the N pre-driver group 48 via a signal line selected based on the signal RONNO_OCD<7: 0>. That is, the NMOS output control circuit 45 selects the signal line (s) through which the output signal is transmitted to the N pre-driver group 48 based on the signal RONNO_OCD<7: 0>.

The pre-driver 46 transmits a voltage based on the output signal received from the output control circuit 43 to the output buffer 49. The pre-driver 46 includes the P pre-driver group 47 and the N pre-driver group 48.

The P pre-driver group 47 outputs an inverted signal of the output signal to a PMOS output buffer group 50. The P pre-driver group 47 includes 8 P pre-drivers 47<0> to 47<7> corresponding to bits of the signal RONPO_OCD<7: 0>. The P pre-drivers 47<0> to 47<7> have the same configuration. Hereinafter, a P pre-driver corresponding to a signal RONPO_OCD<m> (where m is an integer satisfying 0≤m<7) is referred to as a P pre-driver 47<m>. The P pre-driver 47<m> can receive the Ron setting value information and a signal RONNOorg<7: 0> including no ZQ information from the Ron_DAC register 41 and can change a transistor size of the NMOS transistors in the P pre-driver 47<m> based on the Ron setting value information and the signal RONNOorg<7: 0>. The P pre-driver 47<m> will be described below.

The N pre-driver group 48 outputs an inverted signal of the output signal to an NMOS output buffer group 51. The N pre-driver group 48 includes 8 N pre-drivers 48<0> to 48<7> corresponding to the bits of the signal RONNO_OCD<7: 0>. The N pre-drivers 48<0> to 48<7> have the same configuration. Hereinafter, an N pre-driver 48 corresponding to a signal RONNO_OCD<m> (where m is an integer satisfying 0≤m<7) is referred to as an N pre-driver 48<m>. The N pre-driver 48<m> can receive the Ron setting value information and a signal RONPOorg<7: 0> including no ZQ information from the Ron_DAC register 41 and can change a transistor size of the NMOS transistors in the N pre-driver 48<m> based on the Ron setting value information and the signal RONPOorg<7: 0>. The N pre-driver 48<m> will be described below.

The output buffer 49 converts the output signal from the pre drivers 46 into an appropriate voltage level and outputs the voltage level to the controller 200 via the pad 30<0>. The output buffer 49 includes the PMOS output buffer group 50 and the NMOS output buffer group 51.

The PMOS output buffer group 50 applies a voltage VCCQ at the "H" level to the pad 30<0> when an output signal of the P pre-driver group 47 has the "L" level. The PMOS output buffer group 50 includes 8 PMOS output buffers 50<0> to 50<7> connected to the 8 P pre-drivers 47<0> to 47<7>. Hereinafter, a PMOS output buffer connected to the P pre-driver 47<m> is referred to as a PMOS output buffer 50<m>.

The PMOS output buffers 50<0> to 50<7> include PMOS transistors 61<0> to 61<7>, respectively. Hereinafter, a PMOS transistor corresponding to a PMOS output buffer group 50<m> is referred to as a PMOS transistor 61<m>. In the transistor 61<m>, the gate is connected to the corresponding P pre-driver 47<m>, the voltage VCCQ is applied to a source, and a drain is connected to the pad 30<0>.

Each of the 8 transistors 61<0> to 61<7> has a different transistor size (and thus different on-state resistances Ronp). For example, the on-state resistance Ronp of the transistors 61<0> to 61<7> may have the relation of (61<0>)< (61<1>)< . . . <(61<7>). The transistor sizes (a composite on-state resistance Ronp) of the PMOS transistors 61 in the PMOS output buffer group 50 are combinable $2^8$=256 ways by selecting different combinations of one or more of the transistors 61<0> to 61<7>. That is, based on the signal RONPO_OCD<7: 0>, output impedance of the PMOS transistors can be selected from among 256 values The NMOS output buffer group 51 applies a voltage (ground voltage VSS) at the "L" level to the pad 30<0> when an output signal of the N pre-driver group 48 has the "H" level. The NMOS output buffer group 51 includes 8 NMOS output buffers 51<0> to 51<7> connected to 8 N pre-drivers 48<0> to 48<7>, respectively. Hereinafter, an NMOS output buffer connected to the N pre-driver 48<m> is referred to as an NMOS output buffer 51<m>.

The NMOS output buffers 51<0> to 51<7> include NMOS transistors 62<0> to 62<7>, respectively. Hereinafter, an NMOS transistor corresponding to the NMOS output buffer 51<m> is referred to as an NMOS transistor 62<m>. In the transistor 62<m>, the gate is connected to the corresponding N pre-driver 48<m>, the source is at ground (the voltage VSS is applied), and the drain is connected to the pad 30<0>.

Each of the 8 transistors 62<0> to 62<7> has a different transistor size (on-state resistance Ronn). For example, the on-state resistance Ronn of the transistors 62<0> to 62<7> may have a relation of (62<0>)<(62<1>)<<(62<7>). The transistor sizes (a composite on-state resistance Ronn) of the NMOS transistors 62 in the NMOS output buffer group 51 are combinable $2^8$=256 ways by selecting different combinations of one or more of the transistors 62<0> to 62<7>. That is, based on the signal RONNOOCD<7: 0>, output impedance of the NMOS transistors can be selected from among 256 different values.

1.1.6 P Pre-Driver Group

Figure 5:
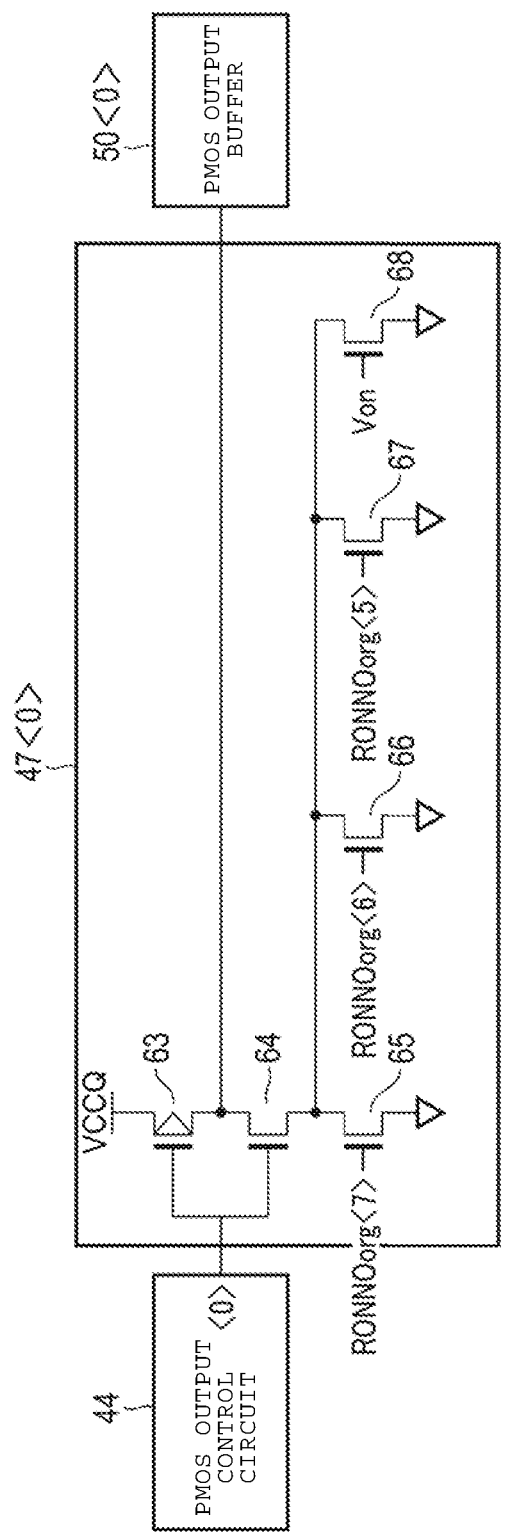
FIG. 5 is a circuit diagram illustrating a P pre-driver provided in the semiconductor storage device according to the first embodiment.

Next, the P pre-driver group 47 will be described with reference to FIG. 5. In the example of FIG. 5, a circuit diagram of the P pre-driver 47<0> is illustrated and the other P pre-drivers 47<1> to 47<7> have the same configuration. In the example of FIG. 5, the on-state resistance Ronn of the NMOS transistor is adjusted based on a signal RONNOorg<7: 5> of the 3 high-order bits, i.e., the 3 most significant bits, of the signal RONNOorg<7: 0>.

As illustrated in FIG. 5, the P pre-driver 47<0> includes a PMOS transistor 63 and NMOS transistors 64 to 68.

The gate of the transistor 63 is connected to the gate of the transistor 64 and a signal line corresponding to a signal RONPO_OCD<0> of the PMOS output control circuit 44. In the transistor 63, the voltage VCCQ is applied to the source and a drain is connected to the drain of the transistor 64 and the PMOS output buffer 50<0>.

The source of the transistor 64 is commonly connected to the drains of the transistors 65 to 68. The transistors 63 and 64 function as a first inverter. Accordingly, the drains of the transistors 65 to 68 can also be said to be connected to a ground voltage supply terminal of the first inverter. The first inverter inverts an output signal received from the PMOS output control circuit 44 and outputs the inverted signal to the PMOS output buffer 50<0>.

A signal RONNOorg<7> is input to the gate of the transistor 65 and the source of the transistor 65 is grounded.

A signal RONNOorg<6> is input to the gate of the transistor 66 and the source of the transistor 66 is grounded.

A signal RONNOorg<5> is input to the gate of the transistor 67 and the source of the transistor 67 is grounded.

A voltage Von is applied to the gate of the transistor 68 and the source of the transistor 68 is grounded. The voltage Von is a voltage turning on the NMOS transistor and may be, for example, the voltage VCCQ. That is, the transistor 68 is considered to be in a normally on-state.

That is, in the P pre-driver 47<0>, the NMOS transistors 65 to 67, corresponding to bits of the signal RONNOorg<7: 5> which is a part of the Ron information of the NMOS output buffer group 51, are installed. Then, the composite on-state resistance Ronn of the transistors 65 to 68 is adjusted by executing control such that the NMOS transistors 65 to 67 turn on or off based on the value of the signals RONNOorg<7: 5>.

For example, when the signals RONNOorg<7: 5> is data of "111", the transistors 65 to 67 are turned on and the composite on-state resistance Ronn of the transistors 65 to 68 is the lowest. In this case, when an output of the first inverter by the transistors 63 and 64 is inverted from the "H" level to the "L" level, falling of the voltage is relatively steep.

For example, when the signal RONNOorg<7: 5> is data of "000", the transistors 65 to 67 are turned off and the composite on-state resistance Ronn of the transistors 65 to 68 is the highest. In this case, when an output of the first inverter by the transistors 63 and 64 is inverted from the "H" level to the "L" level, falling of the voltage is relatively gentle. The transistor sizes of the transistors 65 to 68 may be the same or may be different.

Any number of NMOS transistors installed corresponding to the signal RONNOorg<7: 0> may be used. For example, one NMOS transistor corresponding to the signal RONNOorg<7> may be installed or 6 NMOS transistors corresponding to a signal RONNOorg<7: 2> may be installed.

In the P pre-driver 47<m>, the number of bits of the signal RONNOorg used to adjust the on-state resistance Ronn can be reduced by selecting the bits used in the signal RONNOorg<7: 0> sequentially from the most significant bit. That is, it is possible to reduce the number of NMOS transistors installed corresponding to the signal RONNOorg<7: 0>. Accordingly, it is possible to reduce the number of transistors for adjusting the on-state resistance Ronn to less than the 8 transistors 62<0> to 62<7> installed in the NMOS output buffer group 51. In the P pre-driver 47<m>, the signals of the high-order bits of a signal RONNO_OCD<7: 0> may be used. Here, since the signal RONNO_OCD<7: 0> is a value obtained by correcting the signal RONNOorg<7: 0>, the high-order bits may be the same in some cases.

1.1.7 N Pre-Driver Group

Figure 6:
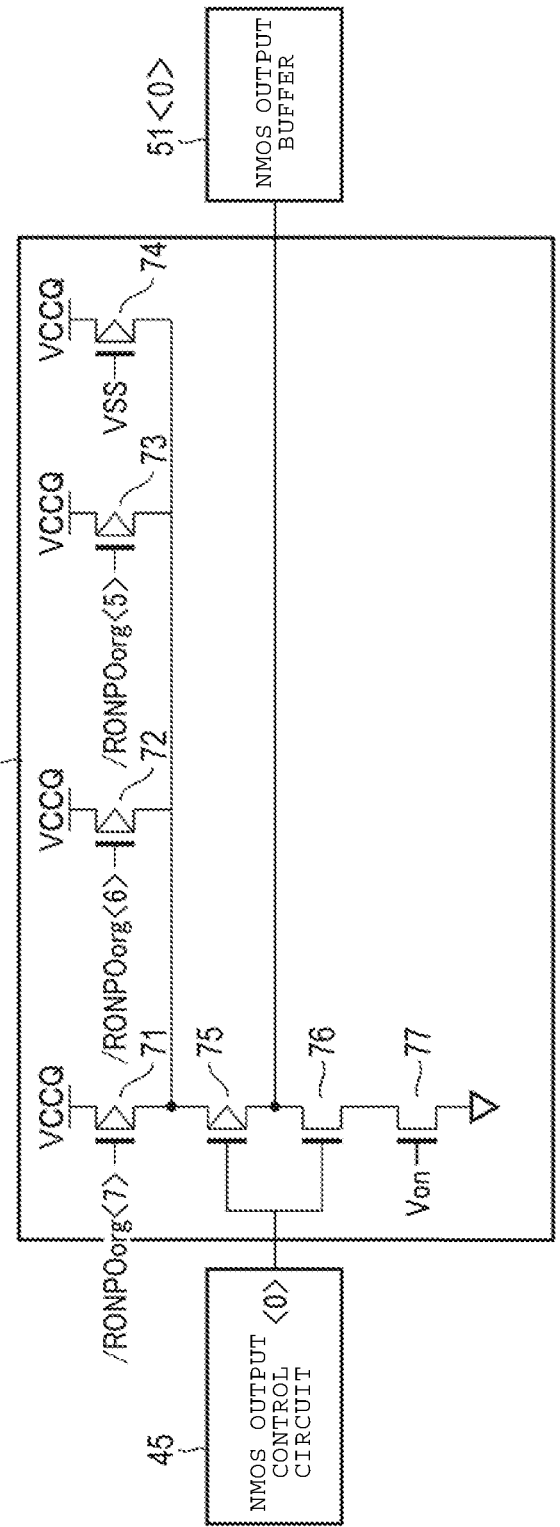
FIG. 6 is a circuit diagram illustrating an N pre-driver provided in the semiconductor storage device according to the first embodiment.

Next, the N pre-driver group 48 will be described with reference to FIG. 6. In the example of FIG. 6, a circuit diagram of the N pre-driver 48<0> is illustrated and the other N pre-drivers 48<1> to 48<7> have the same configuration. In the example of FIG. 6, the on-state resistance Ronp of the PMOS transistor is adjusted based on a signal RONPOorg<7: 5> of the 3 high-order bits of the signal RONPOorg<7: 0>.

As illustrated in FIG. 6, the N pre-driver 48<0> includes PMOS transistors 71 to 75 and NMOS transistors 76 to 77.

The gate of the transistor 75 is connected to the gate of the transistor 76 and to a signal line corresponding to a signal RONNO_OCD<0> of the NMOS output control circuit 45. In the transistor 75, the source is connected to the drains of the transistors 71 to 74 and the drain is connected to the drain of the transistor 76 and to the NMOS output buffer 51<0>.

The source of the transistor 76 is connected to the drain of the transistor 77. The transistors 75 and 76 function as a second inverter. Accordingly, the drains of the transistors 71 to 74 can also be said to be connected to a power voltage supply terminal of the second inverter. The second inverter inverts an output signal received from the NMOS output control circuit 45 and outputs the inverted signal to the NMOS output buffer 51<0>.

An inverted signal /RONPOorg<7> of the signal RONPOorg<7> is input to the gate of the transistor 71 and the voltage VCCQ is applied to the source of the transistor 71.

An inverted signal /RONPOorg<6> of the signal RONPOorg<6> is input to the gate of the transistor 72 and the voltage VCCQ is applied to the source of the transistor 72.

An inverted signal /RONPOorg<5> of the signal RONPOorg<5> is input to the gate of the transistor 73 and the voltage VCCQ is applied to the source of the transistor 73.

The voltage VSS is applied to the gate of the transistor 74 and the voltage VCCQ is applied to the source of the transistor 74. That is, the transistor 74 is considered to be in a normally on-state.

That is, is, in the N pre-driver 48<0>, the PMOS transistors 71 to 73 corresponding to bits of the signal RONPOorg<7: 5>, which is a part of the Ron information of the PMOS output buffer group 50, are installed. Then, the composite on-state resistance Ronp of the transistors 71 to is adjusted by executing control such that the PMOS transistors 71 to 73 turn on or off based on the value of the signal RONPOorg<7: 5>.

The voltage Von is applied to the gate of the transistor 77 and the source of the transistor 77 is grounded. That is, the transistor 77 is in the normally on-state.

For example, when the signal RONPOorg<7: 5> is data of "111", that is, the inverted signal /RONPOorg<7: 5> is data of "000", the transistors 71 to 73 are turned on and the composite on-state resistance Ronp of the transistors 71 to 74 is the lowest. In this case, when an output of the second inverter by the transistors 75 and 76 is inverted from the "L" level to the "H" level, rising of the voltage is relatively steep.

For example, when the signal RONPOorg<7: 5> is data of "000", that is, the inverted signal /RONPOorg<7: 5> is data of "111", the transistors 71 to 73 are turned off and the composite on-state resistance Ronp of the transistors 71 to 74 is the highest. In this case, when an output of the second inverter by the transistors 75 and 76 is inverted from the "L" level to the "H" level, rising of the voltage is relatively gentle.

Any number of PMOS transistors may be installed to correspond to the signal RONPOorg<7: 0> which is used.

In the N pre-driver 48<m>, the number of bits of the signal RONPOorg used to adjust the on-state resistance Ronp can be reduced by selecting the bits used in the signal RONPOorg<7: 0> sequentially from the most significant bit. That is, it is possible to reduce the number of PMOS transistors installed corresponding to the signal RONPOorg<7: 0>. Accordingly, it is possible to reduce the number of transistors for adjusting the on-state resistance Ronp to less than the 8 transistors 61<0> to 61<7> installed in the PMOS output buffer group 50. In the N pre-driver 48<m>, a signal of high-order bits of a signal RONPO_OCD<7: 0> may be used. Here, since the signal RONPO_OCD<7: 0> is a value obtained by correcting the signal RONPOorg<7: 0>, the high-order bits are the same in some cases.

1.2 Specific Example of Operation of Output Circuit

Figure 7:
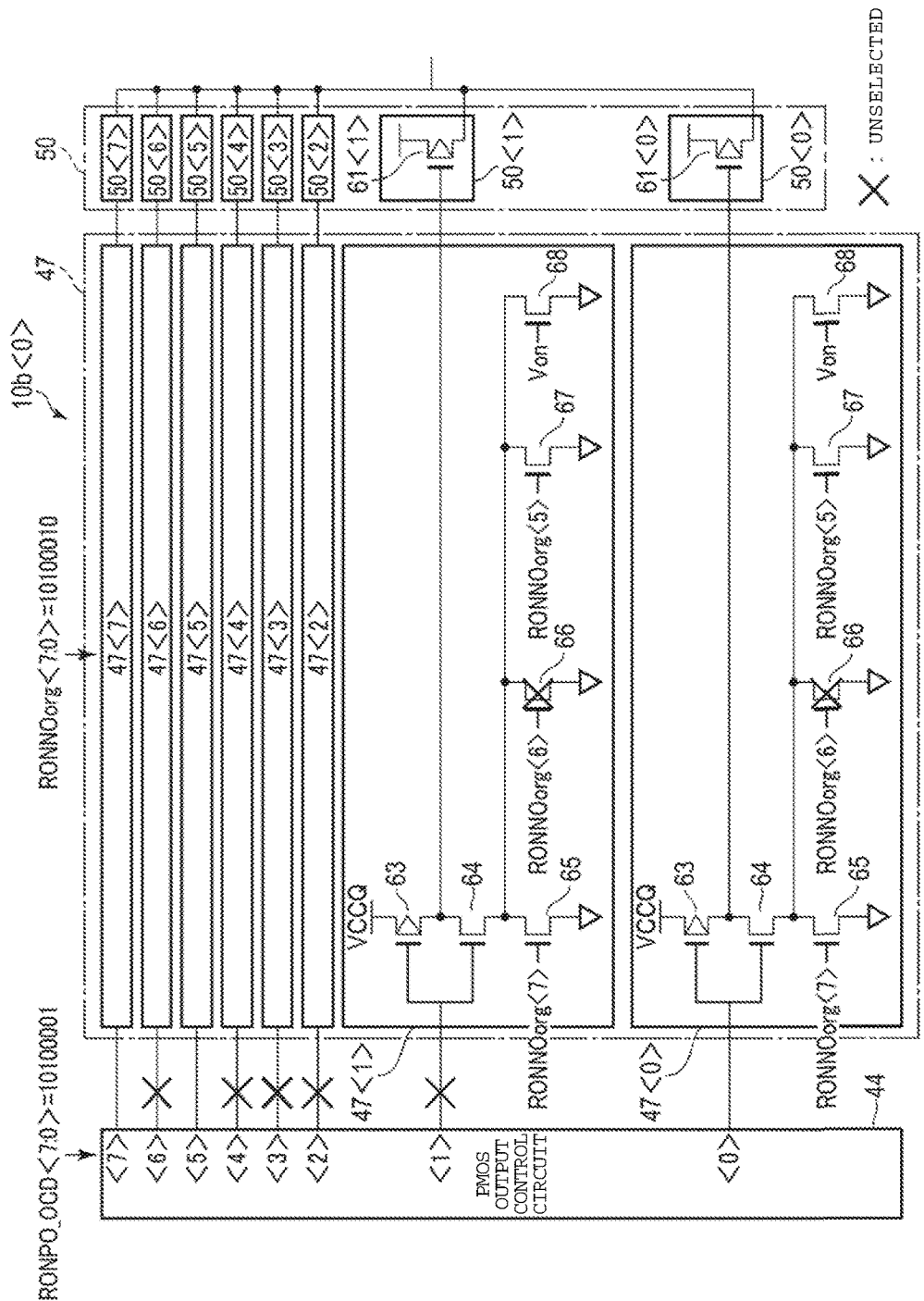
FIG. 7 is a diagram illustrating an example of an operation in an output circuit provided in the semiconductor storage device according to the first embodiment.

Next, a specific example of an operation of the output circuit 10b will be described with reference to FIG. 7. FIG. 7 illustrates an example of the PMOS output control circuit 44, the P pre-driver group 47, and the PMOS output buffer group 50 in the output circuit 10b<0>. In the example of FIG. 7, to simplify the description, the details of the P pre-drivers 47<2> to 47<7> of the P pre-driver group 47 are omitted, but the P pre-drivers 47<2> to 47<7> have the same configuration as the P pre-drivers 47<0> and 47<1>. In addition, the details of the PMOS output buffers 50<2> to 50<7> of the PMOS output buffer group 50 are omitted. The PMOS output buffers 50<2> to 50<7> have the same configuration as the PMOS output buffers 50<0> and 50<1>.

As illustrated in FIG. 7, an example case in which the signal RONNOorg<7: 0> is data of "10100010" and the signal RONPO_OCD<7: 0> is data of "10100001" will be described. The PMOS output control circuit 44 selects signal lines corresponding to the signals RONPO_OCD<7>, RONPO_OCD<5>, and RONPO_OCD<0> based on the data of "10100001" of the signal RONPO_OCD<7: 0> and transmits output signals to the P pre-drivers 47<7>, 47<5>, and 47<0>. In the P pre-driver group 47, based on data of "101" of high-order 3 bits of the data of "10100010" of the signal RONNOorg<7: 0>, the transistor 65 corresponding to the signal RONNOorg<7> and the transistor 67 corresponding to the signal RONNOorg<5> are turned on (selected) and the transistor 66 corresponding to the signal RONNOorg<6> is turned off (unselected). Accordingly, when the output signal is at the "H" level, a voltage with the "H" level is applied from the transistors 61<7>, 61<5>, and 61<0> of the PMOS output buffers 50<7>, 50<5>, and 50<0> to the pad 30<0>.

1.3 Calculating Ron Information in Test Process Before Product Shipment

Figure 8:
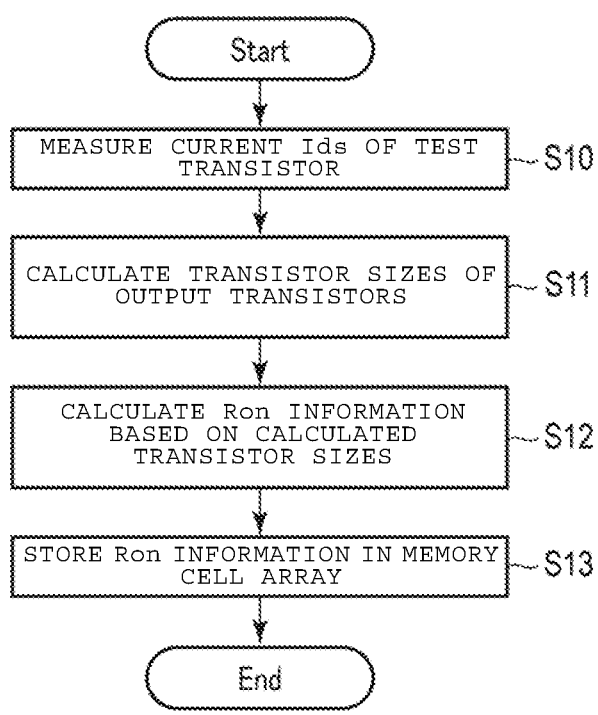
FIG. 8 is a flowchart illustrating a test process before product shipment in the semiconductor storage device according to the first embodiment when Ron information is calculated using a test transistor.

Next, calculating the Ron information in a test process before product shipment will be described with reference to FIG. 8. In the example of FIG. 8, a case in which a test transistor (not illustrated) contained in a chip of the NAND flash memory 100 is used will be described. For example, the test transistor is used when a manufacturing variation of the transistors (for example, a variation in the on-state resistance Ron or a threshold voltage) is measured in a test process. A test PMOS transistor may have the same size as any of the transistors 61<0> to 61<7> of the output buffer 49 or a test NMOS transistor may have the same size as any of the transistors 62<0> to 62<7> of the output buffer 49.

As illustrated in FIG. 8, a current Ids between the source and drain of the test transistor is first measured (S10). More specifically, in the case of the test PMOS transistor, the same voltage VCCQ as the output buffer is applied to a source and the voltage VCCQ/2 is applied to a drain. In this state, the current Ids in a state in which the test PMOS transistor is turned on is measured. Similarly, in the case of the test NMOS transistor, the voltage VCCQ/2 is applied to a drain and a source is grounded. In this state, the current Ids in a state in which the tests NMOS transistor is turned on is measured.

Subsequently, since the output impedance is narrowed to be suitable for the setting value, the transistor sizes of the output transistors of the output buffer 49 are calculated from a measurement result of the current Ids (step S11). More specifically, when R is the setting value of the output impedance, a current I necessary for the output transistor satisfies I=(VCCQ/2)/R. When Wtest is a gate width of the test transistor, the transistor size (gate width W) of the output transistor satisfies W=(I/Ids)×Wtest. A PMOS transistor size and a NMOS transistor size are calculated using this expression.

Subsequently, the Ron information is calculated based on the calculated transistor sizes (step S12). More specifically, the Ron information, that is, the signal RONPOorg<7: 0>, is determined so that a composite transistor size obtained by combining the PMOS transistors 61<0> to 61<7> of the PMOS output buffer group 50 has a value closest to the calculated PMOS transistor size. Similarly, the Ron information, that is, the signal RONNOorg<7: 0>, is determined so that a composite transistor size obtained by combining the NMOS transistors 62<0> to 62<7> of the NMOS output buffer group 51 has a value closest to the calculated NMOS transistor size.

Subsequently, the calculated Ron information is stored in the memory cell array 21 (step S13).

1.4 Advantages According to Example Embodiment

According to the present disclosure, it is possible to improve the reliability of a semiconductor storage device. Hereinafter, this advantage will be described in more detail.

For example, since the output impedance is narrowed to be suitable for a setting value, the transistor size of the output buffer is adjusted. When the transistor size of the pre-driver is not adjusted, timings of rising and falling of a voltage of an output signal deviate in some cases due to the variation in the drivability of the pre-driver due to transistor size variations in the pre-driver.

Figure 9:
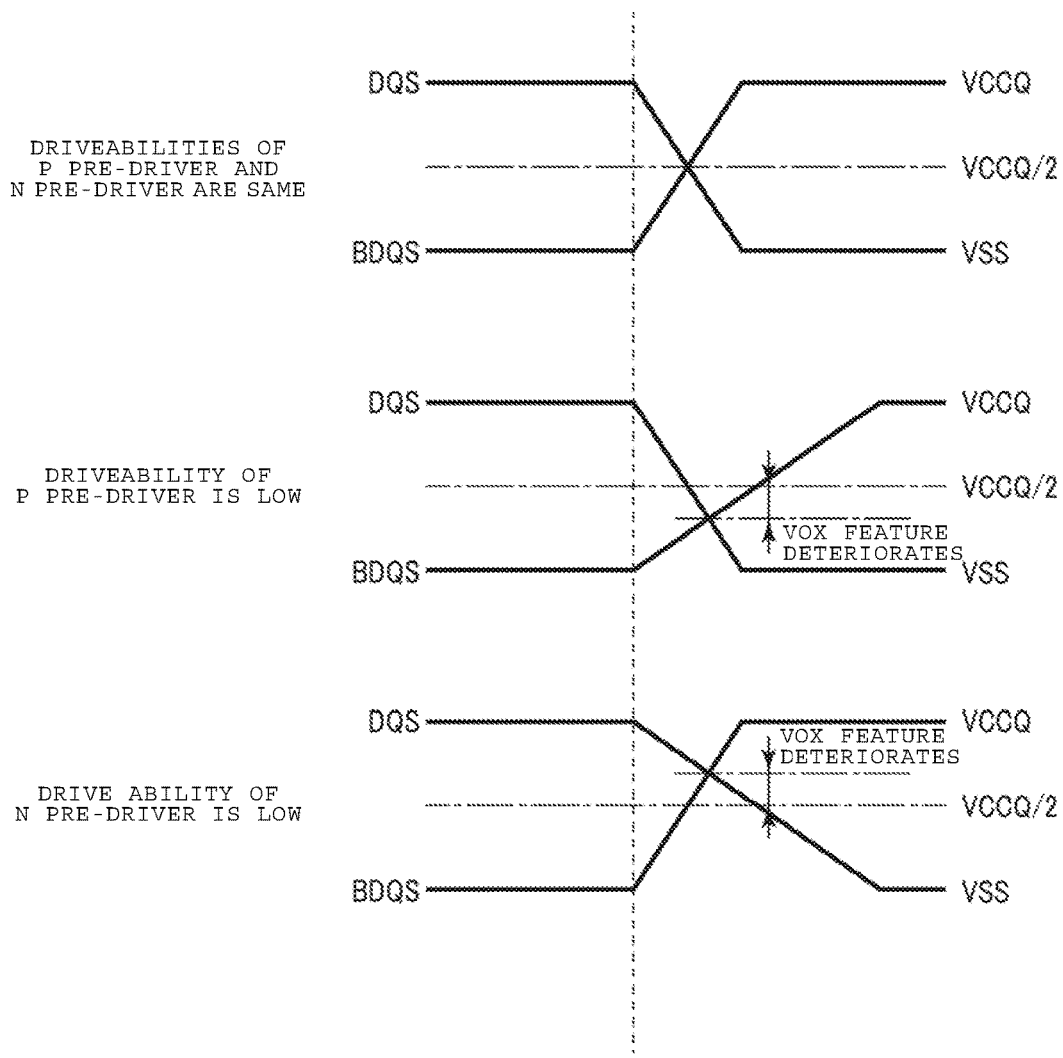
FIG. 9 is a diagram illustrating a relation between a drive ability of a pre-driver and outputs of signals DQS and BDQS.

As illustrated in FIG. 9, when the drivabilities of the P pre-driver and the N pre-driver are the same in the signals DQS and BDQS, signal inversion of the signals DQS and BDQS ends at the same timing. Therefore, an intersection point of the signals is a voltage VCCQ/2.

When the drivability of the NMOS transistor in the P pre-driver is low, the signal BDQS is inverted from the "L" level to the "H" level, that is, a timing of rising from the voltage VSS to the voltage VCCQ is later than a timing of inversion of the signal DQS. More specifically, for example, the output impedance is narrowed to be suitable for the setting value. Therefore, when it is necessary to enlarge the transistor size of the NMOS transistor of the NMOS output buffer, supply of a voltage with the "L" level from the P pre-driver to the PMOS output buffer may be delayed due to the drivability of the NMOS transistor unless the transistor size of the NMOS transistor in the P pre-driver is enlarged. As a result, application of the voltage with the "H" level in the PMOS output buffer is delayed. In this case, an intersection point of the signals DQS and BDQS is lowered from the voltage VCCQ/2 by a voltage VOX. The voltage VOX indicates a deviation amount from the voltage VCCQ/2. As the value of the voltage VOX is larger, that is, the VOX feature further deteriorates, a delay time (skew) occurs when the controller takes in the output signal. Accordingly, an effective time at the time of taking in the output signal decreases and the reliability of the output signal deteriorates.

When the drivability of the PMOS transistor in the N pre-driver is low, a timing of inversion of the signal DQS from the "H" level to the "L" level is later than a timing of inversion of the signal BDQS. More specifically, for example, the output impedance is narrowed to be suitable for the setting value. Therefore, when it is necessary to enlarge the transistor size of the PMOS transistor of the PMOS output buffer, supply of a voltage with the "H" level from the N pre-driver to the NMOS output buffer may be delayed due to the drive ability of the PMOS transistor unless the transistor size of the PMOS transistor in the N pre-driver is enlarged. As a result, application of the voltage with the "L" level in the NMOS output buffer is delayed. In this case, an intersection point of the signals DQS and BDQS is raised from the voltage VCCQ/2 by the voltage VOX. Thus, the VOX feature further deteriorates.

According to the embodiment, however, the transistor size of the pre-driver can also be adjusted using the Ron information for adjusting the transistor size of the output buffer. More specifically, the transistor size of the PMOS transistor in the N pre-driver can be adjusted using the Ron information (the signal RONPOorg) used to adjust the transistor size of the PMOS transistor. The transistor size of the NMOS transistor in the P pre-driver can be adjusted using the Ron information (the signal RONNOorg) used to adjust the transistor size of the NMOS transistor. Accordingly, it is possible to reduce a variation in the drive ability of the pre-driver due to a variation in the transistor size. Accordingly, it is possible to improve the VOX feature. Thus, it is possible to improve the reliability of the semiconductor storage device.

Further, according to the embodiment, the skew in the signals DQS and the BDQS can be reduced by improving the VOX feature. Accordingly, it is possible to improve a communication speed.

2. Second Embodiment

Next, a second embodiment will be described. In the second embodiment, a case in which the ZQ information is used as the signal RONPOorg<7: 0> and RONNOorg<7: 0> will be described. Hereinafter, only differences from the first embodiment will be described.

2.1 Output Circuit

Next, the output circuit 10b will be described with reference to FIG. 10.

Figure 10:
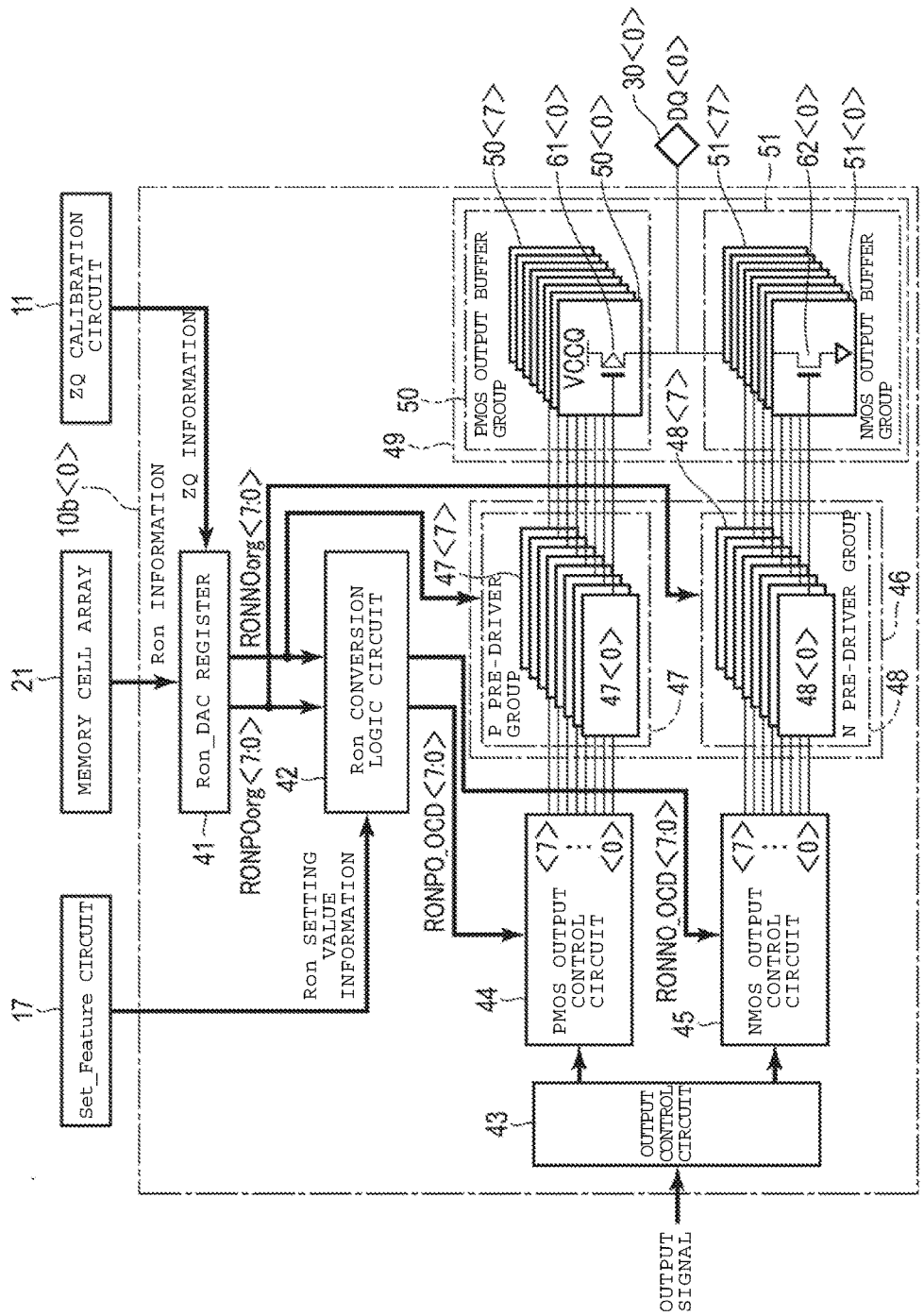
FIG. 10 is a block diagram illustrating an output circuit provided in a semiconductor storage device according to a second embodiment.

As illustrated in FIG. 10, a difference from FIG. 4 of the first embodiment is that the ZQ information is stored in the Ron_DAC register 41. Thus, when the ZQ information is not supplied to the Ron_DAC register 41, the signal RONPOorg<7: 0> based on the Ron information is transmitted to the Ron conversion logic circuit 42 and the N pre-driver group 48 and the signal RONNOorg<7: 0> based on the Ron information is transmitted to the Ron conversion logic circuit 42 and the P pre-driver group 47.

On the other hand, when the ZQ information is supplied to the Ron_DAC register 41, the signal RONPOorg<7: 0> based on the ZQ information is transmitted to the Ron conversion logic circuit 42 and the N pre-driver group 48 and the signal RONNOorg<7: 0> based on the ZQ information is transmitted to the Ron conversion logic circuit 42 and the P pre-driver group 47.

2.2 Advantages According to Second Embodiment

According to the second embodiment, the same advantages as those of the first embodiment can be obtained.

Further, according to the second embodiment, the signal RONPOorg<7: 0> based on the ZQ information can be transmitted to the Ron conversion logic circuit 42 and the N pre-driver group 48 and the signal RONNOorg<7: 0> based on the ZQ information can be transmitted to the Ron conversion logic circuit 42 and the P pre-driver group 47. That is, the pre-driver 46 and the output buffer 49 can be controlled based on the ZQ information.

3. Third Embodiment

Next, a third embodiment will be described. In the third embodiment, a case in which a transistor size is calculated using a transistor in an output buffer in a test process will be described. Hereinafter, only differences from the first and second embodiments will be described.

3.1 Calculating Ron Information in Test Process Before Product Shipment

Figure 11:
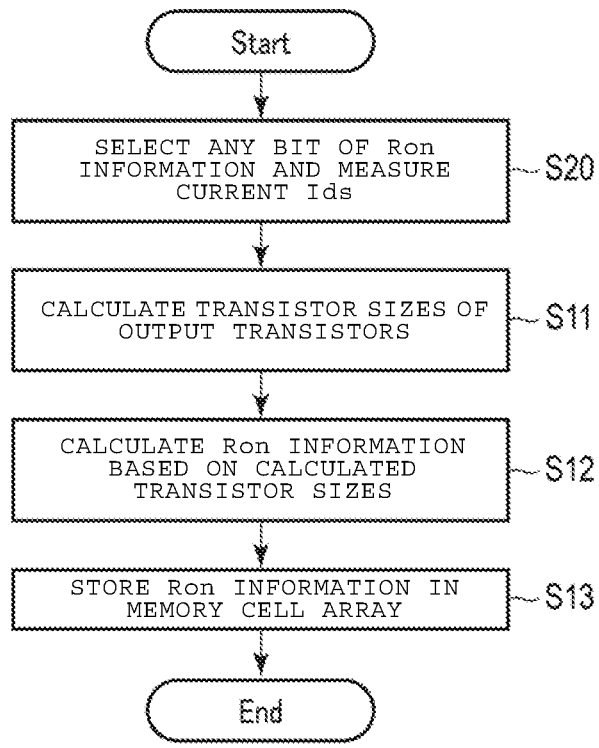
FIG. 11 is a flowchart illustrating a test process before product shipment in a semiconductor storage device according to a third embodiment when Ron information is calculated using a transistor of an output buffer.

Calculating the Ron information in a test process before product shipment will be described with reference to FIG. 11. In the example of FIG. 11, a case in which a transistor of the output buffer 49 is used will be described.

As illustrated in FIG. 11, any bit of the Ron information is first selected and a current Ids of one transistor of the output buffer 49 is measured (step S20).

More specifically, when the current Ids of the PMOS transistor is measured, for example, the signal RONPOorg<0> corresponding to the PMOS transistor 61<0> of the PMOS output buffer group 50 is assumed to be data of "1" and other bits are assumed to be data of "0" in the output circuit 10b<0>. Then, the signal RONPO_OCD is set in the same way as, for example, the signal RONPOorg. In the signals RONNOorg and RONNO_OCD, any data other than all data of "0" can be set. When an output signal of data of "1" is input to the output control circuit 43 in this state, the transistor 61<0> is turned on. In this state, the current Ids of the transistor 61<0> when the voltage of the pad 30<0> becomes VCCQ/2 is measured. Even when the current Ids of the NMOS transistor is measured, for example, the NMOS transistor 62<0> of the NMOS output buffer group 51 is similarly set to be turned on and the current Ids of the transistor 62<0> is measured.

Subsequently, since the output impedance is narrowed to be suitable for the setting value, the transistor size of the output transistor of the output buffer 49 is calculated from a measurement result of the current Ids (step S11). More specifically, when Wsel is a gate width of the selected transistor of the output buffer 49 (in the above-described example, the transistor 61<0> or 62<0>) as in FIG. 8 of the first embodiment, the transistor size (gate width W) of the output transistor satisfies W=(I/Ids)×Wsel. A PMOS transistor size and a NMOS transistor size are calculated using this expression.

Subsequently, as in FIG. 8 of the first embodiment, the Ron information is calculated based on the calculated transistor sizes (step S12).

Subsequently, the calculated Ron information is stored in the memory cell array 21 (step S13).

3.2 Advantages According to Third Embodiment

According to the third embodiment, the same advantages as those of the first and second embodiments can be obtained.

4. Modification Examples

The semiconductor storage device according to the foregoing embodiments includes: a first terminal (30<0>) that outputs a signal to the external device (200); a plurality of first output buffers (PMOS output buffers 50<m>) and a plurality of second output buffers (NMOS output buffer 51<m>) that are connected to the first terminal; a register (Ron_DAC register 41) that retains a first signal (RONNOorg) corresponding to the plurality of second output buffers and a second signal (RONPOorg) corresponding to the plurality of first output buffers; a plurality of first pre-drivers (the P pre-driver 47<m>) that are respectively connected to the plurality of first output buffers and include a plurality of first transistors (65 to 67) connected in parallel to a first inverter (the transistors 63 and 64) and a ground voltage supply terminal of the first inverter, and in which the plurality of first transistors operate in accordance with the first signal (RONNOorg); a plurality of second pre-drivers (N pre-driver 48<m>) that are respectively connected to the plurality of second output buffers and include a plurality of second transistors (71 to 73) connected in parallel to a second inverter (the transistors 75 and 76) and a power voltage supply terminal of the second inverter, in which the plurality of second transistors operate in accordance with the second signal (RONPOorg); a first output control circuit (the PMOS output control circuit 44) that is connected to the plurality of first pre-drivers via a plurality of first signal lines and is able to select at least one of the plurality of first signal lines in accordance with a third signal (RONPO_OCD) obtained by converting the second signal; a second output control circuit (the NMOS output control circuit 45) that is connected to the plurality of second pre-drivers via a plurality of second signal lines and is able to select at least one of the plurality of second signal lines in accordance with a fourth signal (RONNO_OCD) obtained by converting the first signal; and a third output control circuit (the output control circuit 43) that transmits an output signal to the first and second output control circuits.

By applying the foregoing embodiments, it is possible to provide the semiconductor storage device capable of improving reliability.

Embodiments are not limited to the above-described example embodiments, and may be modified in various forms.

For example, the foregoing embodiments are not limited to semiconductor storage devices in which NAND flash memories are used, and can also be applied to semiconductor storage devices in which other memory types are used. Further, the foregoing embodiments can also be applied to semiconductor devices including no memories.

Further, "connection" in the present disclosure also includes, for example, indirect connections made via others circuit elements such as transistors or resisters.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the inventions.

What is claimed is:

1. A semiconductor storage device, comprising:
a first terminal configured to output a signal to an external device;
a plurality of first output buffers and a plurality of second output buffers connected to the first terminal;
a register configured to retain a first signal corresponding to the plurality of second output buffers and a second signal corresponding to the plurality of first output buffers;
a plurality of first pre-drivers, each first pre-driver connected to one of the plurality of first output buffers, each first pre-driver including a plurality of first transistors connected in parallel between a first inverter and a ground voltage supply terminal, wherein the plurality of first transistors are configured to operate in accordance with values of the first signal;
a plurality of second pre-drivers, each second pre-driver connected to one of the plurality of second output buffers, each second pre-driver including a plurality of second transistors connected in parallel between a second inverter and a power voltage supply terminal, wherein the plurality of second transistors are configured to operate in accordance with values of the second signal;
a first output control circuit connected to the plurality of first pre-drivers through a plurality of first signal lines, the first output control circuit configured to select at least one of the plurality of first signal lines in accordance with values of a third signal corresponding to a conversion of the second signal;
a second output control circuit connected to the plurality of second pre-drivers through a plurality of second signal lines, the second output control circuit configured to select at least one of the plurality of second signal lines in accordance with values of a fourth signal corresponding to a conversion of the first signal; and
a third output control circuit configured to transmit an output signal to the first and second output control circuits.

2. The semiconductor storage device according to claim 1, further comprising:
a second terminal to which a resistive element is connected; and
a calibration circuit connected to the second terminal, wherein
the third signal is generated based on a calibration result from the calibration circuit and the second signal; and
the fourth signal is generated based on the calibration result from the calibration circuit and the first signal.

3. The semiconductor storage device according to claim 2, wherein the calibration circuit is configured to calibrate the output impedance of the plurality of first output buffers and the plurality of second output buffers.

4. The semiconductor storage device according to claim 1, further comprising:
a first circuit configured to retain setting values of the plurality of first and second output buffers, wherein
the third signal is generated based on the setting value retained by the first circuit and the second signal; and
the fourth signal is generated based on the setting value retained by the first circuit and the first signal.

5. The semiconductor storage device according to claim 1, wherein
the plurality of first output buffers include a plurality of PMOS transistors, each with at least one transistor property that is different from the others; and
the plurality of second output buffers include a plurality of NMOS transistors, each with at least one transistor property that is different from the others.

6. The semiconductor storage device according to claim 5, wherein the at least one transistor property is transistor gate width.

7. The semiconductor storage device according to claim 1, wherein
the plurality of first transistors are NMOS transistors; and
the plurality of second transistors are PMOS transistors.

8. The semiconductor storage device according to claim 1, further comprising:
a second terminal connected to a resistive element; and
a calibration circuit connected between the second terminal and the register, the calibration circuit configured to provide a calibration value for an output impedance of the plurality of first and second output buffers; and the register retains the calibration value provided by the calibration circuit.

9. The semiconductor storage device according to claim 8, wherein the calibration circuit is configured to calibrate the output impedance based on an output impedance at a lower-limit operating temperature and an upper-limit operating temperature of the semiconductor storage device.

10. A semiconductor storage device, comprising:

a first terminal configured to output a signal to an external device;

a plurality of first output buffers and a plurality of second output buffers connected to the first terminal;

a register configured to retain a first signal corresponding to the plurality of second output buffers and a second signal corresponding to the plurality of first output buffers;

a plurality of first pre-drivers, each first pre-driver configured to provide a voltage to one of the plurality of first output buffers, each first pre-driver including a plurality of first transistors connected in parallel between a first inverter and a ground voltage supply terminal of the first inverter, and wherein the plurality of first transistors are configured to operate in accordance with values of the first signal;

a plurality of second pre-drivers, each second pre-driver configured to provide a voltage to one of the plurality of second output buffers, each second pre-driver including a plurality of second transistors connected in parallel between a second inverter and a power voltage supply terminal of the second inverter, wherein the plurality of second transistors are configured to operate in accordance with values of the second signal;

a first output control circuit connected to the plurality of first pre-drivers through a plurality of first signal lines, the first output control circuit configured to select at least one of the plurality of first signal lines in accordance with a third signal that is based on the first signal;

a second output control circuit connected to the plurality of second pre-drivers through a plurality of second signal lines, the second output control circuit configured to select at least one of the plurality of second signal lines in accordance with a fourth signal that is based on the second signal; and a third output control circuit configured to transmit an output signal from an external device to the first and second output control circuits.

11. The semiconductor storage device according to claim 10, further comprising:

a second terminal to which a resistive element is connected; and a calibration circuit connected to the second terminal, wherein a calibration result from the calibration circuit and the second signal are used to generate the third signal; and the calibration result from the calibration circuit and the first signal are used to generate the fourth signal.

12. The semiconductor storage device according to claim 11, wherein the calibration circuit is configured to calibrate an output impedance of the plurality of first and second output buffers.

13. The semiconductor storage device according to claim 10, further comprising:

a first circuit configured to retain setting values of the plurality of first and second output buffers, wherein the third signal is generated based on the setting value retained by the first circuit and the second signal; and the fourth signal is generated based on the setting value retained by the first circuit and the first signal.

14. The semiconductor storage device according to claim 10, wherein the plurality of first output buffers include a plurality of PMOS transistors, each with at least one transistor property that is different from the others; and the plurality of second output buffers include a plurality of NMOS transistors, each with at least one transistor property that is different from the others.

15. The semiconductor storage device according to claim 14, wherein the transistor property is transistor gate width.

16. The semiconductor storage device according to claim 10, wherein the plurality of first transistors are NMOS transistors; and the plurality of second transistors are PMOS transistors.

17. The semiconductor storage device according to claim 10, further comprising:

a second terminal connected to a resistive element; and a calibration circuit connected between the second terminal and the register, the calibration circuit configured to provide a calibration value for an output impedance of the plurality of first and second output buffers, wherein the register retains the calibration value provided by the calibration circuit.

18. The semiconductor storage device according to claim 17, wherein the calibration circuit is configured to calibrate the output impedance of the plurality of first and second output buffers based on an output impedance at a lower-limit operating temperature and an upper-limit operating temperature of the semiconductor storage device.

19. A semiconductor memory device circuit having an adjustable output impedance, comprising:

a first output buffer and a second output buffer;

a first pre-driver connected to the first output buffer;

a second pre-driver connected to the second output buffer; and a control circuit configured to:

receive information including on-state resistance of transistors in the first and second output buffers;

generate a first signal based on the received information to be supplied to second output buffer for adjusting an output value of the second output buffer by selecting transistors in the second output buffer; and generate a second signal based on the received information to be supplied to first output buffer for adjusting an output value of the first output buffer by selecting transistors in the first output buffer, wherein at least a portion of the first signal is supplied to the first pre-driver to adjust a composite resistance of transistors in the first pre-driver, and at least a portion of the second signal is supplied to the second pre-drive to adjust a composite resistance of transistors in the second pre-driver.

20. The semiconductor memory device circuit of claim 19, wherein the first output buffer includes a plurality of PMOS transistors, and the second output buffer includes a plurality of NMOS transistors.

* * * * *